United States Patent [19]

Packer

[11] Patent Number: 4,522,865
[45] Date of Patent: Jun. 11, 1985

[54] HOT PRESS-FORGING OF AN OPTICAL BODY WITH DYNAMIC CONSTRAINT BY CRYSTAL POWDER

[75] Inventor: Herbert Packer, Cleveland Heights, Ohio

[73] Assignee: Harshaw/Filtrol Partnership, Cleveland, Ohio

[21] Appl. No.: 524,258

[22] Filed: Aug. 18, 1983

Related U.S. Application Data

[62] Division of Ser. No. 280,923, Jul. 6, 1981, Pat. No. 4,410,468.

[51] Int. Cl.$^3$ .............................................. B32B 7/02
[52] U.S. Cl. .................................... 428/212; 428/218; 428/330; 428/696; 428/702
[58] Field of Search ............... 264/1.2, 319, 320, 325, 264/332; 428/212, 218, 330, 696, 701, 702

[56] References Cited

U.S. PATENT DOCUMENTS

| | | | |
|---|---|---|---|
| 3,767,748 | 10/1973 | Rosette et al. | 264/323 |
| 3,933,970 | 1/1976 | Rosette et al. | 264/320 |
| 4,044,082 | 10/1977 | Rosette | 264/332 |
| 4,071,372 | 1/1978 | Bird | 264/332 |
| 4,081,505 | 3/1978 | Kawai | 264/332 |
| 4,171,400 | 10/1979 | Rosette et al. | 264/1.2 |
| 4,217,318 | 8/1980 | Anderson | 264/1.2 |
| 4,446,100 | 5/1984 | Adlerborn et al. | 264/319 |
| 4,455,275 | 6/1984 | Alderborn et al. | 264/325 |
| 4,478,789 | 10/1984 | Adlerborn et al. | 264/319 |

Primary Examiner—George F. Lesmes
Assistant Examiner—William M. Atkinson
Attorney, Agent, or Firm—James A. Lucas

[57] ABSTRACT

A method is disclosed for hot press-forging a normally frangible optically integral crystalline mass ("optical body") in a closed die, by directly pressing a surface of the mass while it is peripherally surrounded by a crystal powder the amount of which is computed from the deformation ratio desired and the geometry of the die. The crystal powder is compacted by the non-uniformly directed forces transmitted to it by the optical body, and eventually the crystal powder is sufficiently dense so as dynamically to constrain the optical body at its peripheral surface. The dynamic constraint of the optical body while it is being forged is effected in such a way as to permit deformation of the optical body without fracturing it, and, without affecting its optical integrity. Hot press-forging the optical body by peripherally surrounding it with the crystal powder produces a stress environment in which the forces applied in a first stage, to the optical body by the ram of the forging press and, in a second stage, by the crystal powder, are non-uniform both in magnitude as well as in direction. The result is that the optical body may be deformed and forged to obtain a deformation ratio greater than 1.0 so as to obtain a fine-grain structure free of peripheral fissures and "veiling". Typically, a melt-grown essentially single macrocrystal of an ionic salt or of an optical oxide of aluminum or magnesium including certain optical mixed oxides such as bismuth germanium oxide, cadmium tungstate and lithium niobate, is hot press-forged while it is surrounded by a crystal powder of the same ionic salt or oxide. A polycrystalline extrudate of a melt-grown macrocrystal may also be hot press-forged in an analogous manner.

2 Claims, No Drawings

HOT PRESS-FORGING OF AN OPTICAL BODY WITH DYNAMIC CONSTRAINT BY CRYSTAL POWDER

This is a division of application Ser. No. 280,923, filed July 6, 1981, now U.S. Pat. No. 4,410,468.

BACKGROUND OF THE INVENTION

This invention relates to a method for forming a polycrystalline optical body which has higher mechanical strength than a melt-grown essentially single macrocrystal, also referred to as a macrocrystal ingot, or simply 'ingot', from which the polycrystalline optical body is derived. By "optical body" I refer to one which is essentially completely permeable to wavelengths in the ultraviolet, or visible, or infrared regions. Strong press-forged normally frangible inorganic crystals are known to be produced by hot press-forging a melt-grown macrocrystal ingot. By "normally frangible" I refer to easily breakable or readily cleavable melt-grown ingots such as those of the alkali metal halides, the alkaline earth metal halides and the like, all of which will cleave readily along crystal planes at room temperature or below, and even at elevated temperatures. Though polycrystalline bodies also shatter, ingots shatter along well-defined crystal planes if the ingots are dropped on to a hard surface. Certain inorganic crystals are not normally frangible, such as for example, silver chloride, and this invention is not directed to such crystals.

Optically integral polycrystalline laser windows, domes and lenses which are formed from rectangular blanks greater than 20 cm × 10 cm, or discs greater than 20 cm in diameter, must have superior mechanical properties compared to those of a single crystal, without sacrificing the single crystal's optical integrity. In other words, polycrystalline laser windows and the like must be optically indistinguishable from the single crystal from which they were derived. Often, hot press-forged ingots and extrudates of ingots produce polycrystalline optical bodies having superior optical properties than those of the ingot from which they were derived.

Included among optical bodies are scintillation phosphors which generate light. Such phosphors may include dopands which are generally ionic salts. Scintillation phosphors are used for the detection of ionizing radiation in conjunction with a photomultiplier tube in devices ranging from simple scintillation counters to sophisticated camera plates for medical use in connection with the analysis of gamma radiation emanating from patients who are injected with specific active isotopes. In a large camera plate, it is essential that the plate be mechanically strong and resistant to shock. Such strength and shock resistance is provided in a polycrystalline plate derived by hot press-forging a macrocrystal ingot.

Thus, it is known in the art to hot press-forge a melt-grown macrocrystal ingot of an ionic salt as described in U.S. Pat. No. 3,933,970 to Rosette and Packer, the disclosure of which is incorporated by reference thereto as if fully set forth herein. Though the method described therein is highly effective with alkali metal halide crystals of arbitrary size, it is less effective with alkaline earth metal halides, particularly the halides of calcium, strontium and barium. It was found that a deformation ratio in excess of about 2 could only be produced with a very slow forging if the forged body was to be free of surface defects and peripheral fissures.

It was most particularly noticed that ingots of calcium fluoride could be hot press-forged as described therein, but upon cooling, the forged polycrystalline mass was susceptible to fracture, particularly near its periphery, and "veiling" due presumably to internal unrelieved stresses and undesirable dislocations. By "veiling" I refer to generally planar striations near the surface of the forged body which appear to be generated by gas bubbles or voids formed as the forged crystal cools to room temperature. Those skilled in the art are well aware that an apparently minor surface crack or other flaw ascribed to the hot press-forging process, vitiates the usefulness of the press-forged optical body as a laser window, or as a camera plate, or for any application where mechanical strength is a property of critical importance.

To combat the problems of stress cracks and other flaws such as veiling, a prior art process was developed for hot forging a macrocrystal in an isostatic pressure environment. In this process a macrocrystal was forged in a hot-wall pressure vessel in both oil and gaseous environments. Oil was used effectively to about 450° C., whereas gas allowed reaching 600° C., the temperature limit of the pressure vessel which was used. Forging was effected at temperatures from 300° C. to 600° C. in pressure environments ranging from 5000 psi to as low as 2000 psi. Crack-free crystals were obtained on a reproducible basis by forging at 300° C. or higher when forging was followed by in-situ annealing at 600° C. or higher.

Isostatic pressing is conventionally carried out using an isostatic press which is essentially a pressure chamber filled with a liquid or gaseous medium through which the necessary pressure is applied, essentially uniformly, to a powder held in a bag or other container which is also uniformly deformed. Isostatic pressing is commonly used to densify powder metal or ceramic 'preforms' prior to sintering them. The process is particularly used to compress further, and uniformly, a difficultly compressible silicon nitride preform of compacted power which is also bedded in silicon nitride powder, as for example disclosed in U.S. Pat. No. 4,071,372. As those skilled in the art will recognize, uniformity of application of the pressing forces to obtain continuous equalization of pressure over the body being pressed, combined with precise definition of the form which results, is the nexus of isostatic pressing. Neither continuous equalization of applied pressure nor a well-defined shape are obtained in the process of my invention, and neither is necessary or desirable.

It is also known to employ a powder of an inorganic material having high hardness and cleavage as the solid pressure transmitting medium in an isostatic pressing where it is desired to obtain an improved pressure magnification ratio so that an ultra-high pressure may be applied to a 'preform' embedded in the powder. Such a process is taught in U.S. Pat. No. 4,081,505 but there is no suggestion that the method is used for any purpose other than densification of the preform. There is no significant change of shape of the preform, and no change of any dimension of the preform relative to another of its dimensions. In this patented method the preform must be completely enveloped in powder the amount of which is arbitrary.

SUMMARY OF THE INVENTION

A method is disclosed for hot press-forging a normally frangible optical body which is an optically integral crystalline mass, by applying non-uniformly directed forces transmitted in a first stage, directly to a surface of the optical body to be forged, and then, in a second stage, by dynamically constraining the radially outward movement of the peripheral surface of the optical body while it is being forged, with a predetermined amount of a crystal powder peripherally surrounding the mass so as to effect a staged deformation of the optical body without fracturing it, without affecting its density, and, without affecting its optical integrity. By "dynamically" I refer to changing forces exerted by the crystal powder non-uniformly upon the optical body's peripheral surface, portions of which advance radially outwardly at different rates. By "crystal powder" I refer to crystals in the size range from about 20 microns to about 250 microns.

Typically, a melt-grown essentially single macrocrystal ingot of an ionic salt or an oxide of magnesium, or mixed oxides such as bismuth germanium oxide, cadmium tungstate or lithium niobate, is hot press-forged. The ingot is placed in a die cavity and surrounded with crystal powder of an inorganic material having high hardness and cleavage, and more preferably a crystalline powder of the same salt or oxide as the ingot.

The amount of powder used is determined by (a) the geometry of the die cavity in which the ingot and powder are confined, and, (b) the deformation ratio sought upon completion of the press-forging. The ingot and crystal powder surrounding the ingot are then heated, preferably in an inert atmosphere, to an elevated temperature. While maintaining the ingot and crystal powder at this temperature, the ingot is gradually pressed so as to flatten it sufficiently to obtain a deformation ratio greater than unity (1.0), and preferably greater than 1.2. As the deformation ratio becomes greater than unity, the crystal powder non-uniformly transmits forces exerted during press-forging of the ingot, and gradually dynamically increases the constraint the powder exerts on the peripheral surface of the ingot, allowing the ingot to undergo a transformation from essentially monocrystalline form to a polycrystalline form, without being fractured.

It is critical in the method of this invention that a change of shape be effected sufficient to provide a deformation ratio greater than 1.0, and more preferably in the range from about 1.2 to 10. The deformation ratio is defined as the quotient obtained by dividing the initial height of the optical body to be forged, by the final thickness of the forged optically integral mass. Without a significant change of shape effected by altering a particular dimension of the crystalline mass, there is no press-forging effected.

The resulting press-forged body is a composite having two zones of polycrystallinity. Crystal powder is bonded to the peripheral surfaces of the forged optical body which are in contact with the powder due to forces transmitted to the powder confined in the forging die, so that forces transform the optical body into a polycrystalline composite having two zones of polycrystallinity. The first is a central zone consisting essentially of a fully dense and homogeneous optically integral polycrystalline salt, separated by an interface from, and peripherally surrounded by the second zone which is not optically integral, and which consists essentially of a cluster of compacted hot-pressed crystals. The interface between the two zones is "free-formed", that is, formed by the particular conditions of pressing for the particular optically integral crystalline mass surrounded by a specific quantity of crystal powder, and controlled thereby, varying from one forging to the next. Though the precise location and form of the interface are not known until the press-forging is completed, the presence of the free-form interface is clearly established by the transition from the first zone which is optically integral, to the second zone which is not. A melt-grown macrocrystal or a polycrystalline extrudate of a melt-grown ingot may each be hot press-forged in an analogous manner.

DETAILED DESCRIPTION OF PREFERRED EMBODIMENTS

In its preferred embodiments, this invention is directed to hot press-forging either an essentially single macrocrystal ingot (hereafter 'ingot' for brevity) of a normally frangible optical oxide or ionic salt, or a polycrystalline body derived by extruding such an ingot. By "optical oxide" I refer to magnesium oxide, cadmium tungstate, bismuth germanium oxide, lithium niobate, and the like used to make optical bodies. Extrusion of an ingot of an ionic salt is disclosed in U.S. Pat. No. 3,767,748; a polycrystalline extrudate is disclosed in copending U.S. patent application Ser. No. 215,732 filed Dec. 12, 1980; and multiple extrusion of an ingot is disclosed in U.S. Pat. No. 4,044,082; and all these disclosures are incorporated by reference thereto as if fully set forth herein.

Whether the body to be forged is an ingot or an extrudate, it is a crystalline mass which is optically integral. Such a body is hereafter referred to as "optical body" before it is forged; as "forged optical body" after it is forged; and, as "forging body" during the period when it is being forged because it undergoes a minimum deformation sufficient to give it a substantial change of shape. For the purposes of this invention, a properly melt-grown ingot of the alkali metal halides or alkaline earth metal halides, namely, the iodides, bromides, chlorides and fluorides thereof, is optically integral; and so is a polycrystalline optical body derived from such an ingot by extrusion, if the body is optically essentially indistinguishable from the ingot from which it was derived. Similarly a properly grown ingot, whether melt-grown or not, of magnesium oxide, bismuth germanium oxide, cadmium tungstate or lithium niobate, is optically integral.

This invention is specifically directed to optical bodies which are optically integral. Optical integrity is exemplified by a properly grown single crystal which has as few undesirable dislocations and characteristics as reasonably possible. If a properly grown single crystal has better than 70% transmittance in a particular wavelength range, it is deemed to be transparent in that range. For example, KRS-5, an alloy of ThI and ThBr has a transmittance of about 70% in the range from about 0.7 micron to about 30 microns; CsI has a transmittance of about 85% in the range from about 0.7 to about 30 microns; and $CaF_2$ has a transmittance of about 90% in the range from about 0.3 to about 7 microns. A crystalline mass of any of the foregoing materials, whether single crystal or polycrystalline, is deemed optically integral and transparent if it meets the criteria for a properly grown single crystal of that material.

The optical bodies of this invention are transparent to at least some portion of the wavelength range from about 0.2 to about 30 microns, and more specifically to radiation in the wavelength range from about 2 to 12 microns. Optical bodies of this invention include those which have an absorption coefficient of less than about 0.1, and more preferably less than 0.01. For example, optically integral $CaF_2$ has a transmittance of about 90% or higher in the wavelength range from about 0.3 to 7 microns, and an absorption coefficient of less than 0.01.

Hot press-forging as practiced in the method of this invention requires that (a) the optical body in a closed forging die, be surrounded with a crystal powder having essentially the same coefficient of thermal expansion as the optical body, and (b) opposite faces of the optical body, against which faces forging forces are directed, be essentially free from contact with the crystal powder. Reference to "crystal powder" herein identifies the powder as comprising discrete crystals, or agglomerates of the crystals before the crystals are hot-pressed in the forging die. After the crystals are hot-pressed they form a dense compact referred to as a cluster compact of crystals, which cluster compact is not optically integral but nevertheless has a density which is generally greater than 98 percent of, and often nearly the same as, that of the optical body.

The method of this invention utilizes a forging force in the direction in which a particular dimension of the body is to be decreased, which force generates sufficient pressure to produce the desired decrease at the forging temperature. The method further utilizes dynamic constraint of the forging body to control the rate of forging and the quality of the forged optical body. This dynamic constraint is applied by the crystal powder upon peripheral surfaces of the optical body, which surfaces are inclined at an angle to the direction of the constraining forces transmitted by the powder from the walls of the die, and preferably the surfaces are at right angles to the direction of the constraining forces. With proper dynamic constraint, a forged optical body is obtained, surrounded by, and pressure-bonded to the cluster compact of crystals. The forged optical body has a peripheral surface free of fissures, and the upper and lower surfaces not in contact with the cluster of compacted crystals are free of veiling. The shape of the periphery of the forged optical body is not precisely controlled since the interface between the optically integral forged body and the non-optically integral cluster compact of crystals is established by dynamic constraint forces exerted upon the forging body.

The hot press-forging method of this invention utilizes a closed forging die in which (a) direct pressure is exerted by the die's ram and anvil on opposite surfaces respectively, of the optical body, and (b) indirect pressure exerted by the crystal powder peripherally surrounding the optical body, in the annular space between the body and the walls of the die. By 'direct pressure' I refer to pressure transmitted to the optical body by the ram and anvil, each suitably coated with graphite, or other coating material to protect their surfaces. Such a coating, typically of graphite cloth or graphite powder, is so thin as to allow the ram or anvil to be considered to be essentially in solid-to-solid contact with the surfaces of the optical body. The opposite faces are substantially free from crystal powder.

The method of this invention is practiced as a two-stage forging method. In the first stage, opposite surfaces of the optical body are placed in solid-to-solid contact with the ram and anvil of a closed die, respectively, so that when a forging force is applied, the peripheral surfaces of the forging body are pressed outwards towards the walls of the die. In this first stage the height or thickness of the forging body is diminished, and its peripheral surface moves outward because this surface is essentially unconstrained. Though surrounded by, and in contact with crystal powder, there is no significant radial constraint on the periphery of the forging body during the first stage.

In the second stage, the crystal powder peripherally surrounding the optical body begins to be compacted by the outward moving periphery of the forging body, and the rate of compaction of the powder is controlled by the rate of advance of the periphery of the forging body. As the forging body moves further outward, the crystal powder is further compacted and in turn exerts an increasing pressure on the surface of the forging body in contact with the powder. When the peripheral pressure is the same as the pressure on the faces in contact with the ram and anvil, there is no further movement. At this point the unit pressure per unit area is the same over the entire area of the mass in the die.

It will now be evident that the method of this invention combines features of a conventional unconfined forging, and of a conventional closed die forging. However, because of the unique staging made possible, first by the direct pressure exerted by the solid-to-solid contact of the upper and lower surfaces of the optical body with the ram and anvil of the die, and then, by forces transmitted by the crystal powder peripherally surrounding the optical body, the combination process is unexpectedly effective to produce a polycrystalline composite. In this composite, the central portion is the forged optical body which is cut away from the surrounding cluster compact of crystals, and polished for use in a conventional manner. The upper, lower and peripheral surfaces of the forged optical body are essentially free from undesirable dislocations evidenced as surface or near-surface defects even when the deformation ratio is in the range from about 1.2 to about 10.

One of the chief reasons staged forging with dynamic constraint of the peripheral radially outward moving surface is so effective, is that dynamic constraint of the forging body compensates for the non-isotropic flow of a hot unmelted normally frangible optical body. Such an optical body of a rigid, low-yielding crystalline material has the propensity, common among such bodies, of advancing its peripheral surface too rapidly for the flow of material from around the center of the body to 'catch up' in the radially unconstrained first stage of the forging process. This lag of flow of material from the center results in fissures propagating from near the periphery of the forging body. Where the material at the periphery is physically mechanically weaker than the main body of the forged mass, cavities may occur due to tension at the surface. Similarly, bubbles or cavities may occur at other locations, generally near the surface of the forged body, and in particular near the surfaces in solid-to-solid contact with the ram and anvil. These near-surface defects are also due to unrelieved internal stresses and are evidenced by veiling.

In the second stage of forging, crystal powder surrounding the periphery of the forging body exerts a pressure at the radially outward moving periphery, which pressure increases as the periphery moves outward, due to compaction of the powder. As a result, there is exerted a non-uniform pressure and a dynamic constraint, radially, which gradually increases until it equals the constraint exerted by the ram and anvil of the die.

Thus the two-stage forging process produces a polycrystalline composite having a central, forged optically integral body separated by an interface from a compacted crystal cluster which is not optically integral. It should be noted that there is no functional reason to interrupt this essentially continuous staged process, but if an interruption does occur, it will not adversely affect the process.

The temperature at which the press-forging is carried out is preferably well above room temperature, but is not critical so long as it is sufficiently high to preserve the integrity of the surfaces of the forging body. As one skilled in the art will appreciate, forging at room temperature is more likely to generate undesirable dislocations than forging at an elevated temperature below the melting point of the optical body to be forged. A preferred temperature is that suggested in the prior art, namely a temperature greater than one-half the melting point measured in degrees Centigrade.

The crystal powder is preferably chosen so that it does not chemically adversely affect the optical or physical properties of the optical body. Since the pressure exerted by the ram will ordinarily be in the range from about 1000 psi to about 5000 psi and may be as high as 10,000 psi or higher depending upon the optical body and the temperature at which it is forged, the preferred crystal powder is of an inorganic material which is not easily crushed, such as $Al_2O_3$, $MgO$, $ZrO_2$, $TiO_2$, $TiC$, $WC$ and the like. It is most preferred to use a powder of the same material as the optical body though it is not essential that the powder have the same purity unless diffusion of the impurities into the forged optical body becomes a problem.

The size range of the crystal powder is critical since powders smaller than 20 microns do not generally provide the desired controlled radial constraint, while powders larger than about 200 microns present too great a void volume to permit accurate calculation of the amount of powder to be poured into the die around the crystalline mass to be forged.

The calculation of the amount of powder to be used is as follows:

If the desired diameter of the forged optical body is $d_f$ and the diameter of the die cavity is $d_c$, and the forged thickness (or height) is $h_f$, then the annular volume of the compacted crystal cluster ($V_c$) which peripherally surrounds the forged optical body is $$V_c = \pi/4 \; h_f(d_c^2 - d_f^2)$$

If the density of the compacted crystal cluster is $\rho_c$ and this density is at least 99% of the density $\rho_o$ of the optical body, or, 99% of the density $\rho_f$ of the forged optical body, since the density of the forged body is identical with the density of the optical body, then the mass of the crystal powder is $0.99 \; V_c \rho_o = 0.99 \; V_c \rho_f$.

If the initial thickness (or height) $h_i$ of a cylindrical ingot to be forged is $2h_f$ so as to give a deformation ratio of 2, then if $d_c$ is from about 5% to about 30%, and more preferably from about 10% to about 20% greater than $d_f$, it will be evident that the surface of a mass $0.99 \; V_c\rho_o$ of discrete crystals, when poured approximately evenly into the annular space between the ingot of diameter $d_i$ and height $h_i$, will lie below the upper surface of the ingot upon which the ram will rest. Though $d_c$ may be more than 30% greater than $d_f$ and yet be operable, it will be found that there are additional complications introduced by unnecessarily large dies, and the greater mass of crystals much of which is unnecessary waste.

The mass of crystals used is thus correlatable to the annular volume of the compacted crystal cluster; the mass of crystals transmits no forces to the ingot in the first stage of the forging, and in the second stage, transmits force from the sidewalls of the die sufficient to constrain the radially outward flow of the periphery of the forging mass.

The following illustrative examples will serve to illustrate the invention.

EXAMPLE 1

An essentially single crystal cylindrical section of a macrocrystal ingot of calcium fluoride having a diameter of about 4" (inches) and a thickness of about 2.66" is centered in a cylindrical 7" diameter cavity, on end, between a graphite coated ram and anvil of a conventional die assembly so that the crystal will be forged by a force exerted in the 110 direction of the crystal. The die is placed in a 750-ton hydraulic press and the die is surrounded by an electrically heated furnace to raise the assembly to, and maintain it at, a desired temperature of about 750° C. A powder of ground $CaF_2$ crystal having a size in the range from about 70 to about 100 mesh, U.S. Standard Sieve Series, is poured around the ingot until the level of powder nearly reaches that of the surface of the centered ingot.

The temperature of the die assembly is then raised gradually and is recorded by a recorder controller in cooperation with a thermocouple inserted in one of the die members. When the assembly reaches the desired temperature, the press is started and commences to descend slowly, flattening the crystal at a rate of about 0.005"/min. When the ram of the press has flattened the crystal to a thickness of about 1.5" the press is shut off, and the ram maintained in place while the temperature is raised to 800° C. to anneal the forged crystalline mass. The annealing temperature of 800° C. is held for about 1 hour, after which the temperature is allowed to drop at a rate of about 10° C./hr until the entire assembly reaches room temperature. The forged crystal mass is then pushed out of the die cavity.

The forged crystalline mass removed from the die cavity is cleaned and found to have a central portion which is polycrystalline and optically integral. The central optically integral portion is separated by an interface from a ring cluster of compacted crystals which is milky in appearance, and not optically integral. The optically integral portion is essentially free from fissures near the interface and shows no surface or near-surface defects either at the peripheral surface or the upper and lower surfaces. The grain size near the periphery of the forged optical body has a size in the range from about 10 microns to about 20 microns, and is smaller than the size of the grains near the center, which latter are in the size range from about 30 microns to about 40 microns. The difference in grain size is smaller when the forging is effected just below the melting point of the ingot, particularly if the forging is at a very slow rate.

The transmittance of the $CaF_2$ ingot was measured before it was forged. The transmittance in the wavelength range from 0.3 micron to 7 microns was higher than 90%. After the ingot was forged, it was polished and a portion conventionally mounted so that its transmittance could be measured. The transmittance in the range from 0.3 to 7.0 microns was found to be greater than 90%. This indicates that the optical integrity of the single crystal was maintained.

In an analogous manner, a polycrystalline section of calcium fluoride which has been cut from an extruded "log" of calcium fluoride is hot press-forged in a two-stage forging peripherally surrounded by 80 mesh $CaF_2$ powder, as above. Again, the central portion of the forged optical body is optically integral, while the periphery is not. As might be expected, the radial gradation of grain size which is readily visible when the single crystal ingot is forged, is not evident unless the polycrystalline section starts with a very large grain size. The transmittance of the optical body before and after it is forged indicates that there is no substantial change in the wavelength range from 0.3 to about 7 microns.

EXAMPLE 2

An essentially single crystal cylindrical section of a macrocrystal ingot of sodium iodide doped with about 0.07 weight percent thallium iodide, having a diameter of about 8.5" and a height of about 4" is centered in a die assembly having a 14" diameter barrel. The die is placed in the 750 ton hydraulic press, and as before surrounded with an electric furnace with appropriate controls. The surfaces of the ram and anvil of the die are covered with graphite cloth coated with graphite. About 4.7 lbs of sodium iodide powder having a size in the range from about 60 to about 80 mesh is poured around the ingot.

The temperature of the die assembly is gradually raised to 500° C. and maintained at that temperature for a short time before the press is started, and the hot crystal is press-forged at a rate of about 0.005 in/hr until the thickness of the forged crystalline mass is 2". The deformation ratio is 2. When the forged crystalline mass is annealed and cooled to room temperature, it is cleaned and polished. The surfaces of the clear central portion of the forged body are found to be free from veiling and surface defects. The diameter of the forged clear central portion is found to be about 12", and it is surrounded by a peripheral ring of hot-pressed powder which is milky and non-optically integral. The central portion which is optically integral is separated from the non-optically integral portion by an interface the diameter of which varies from about 11.75" to about 12.25". When the forged crystal is polished at the interface it is seen that its peripheral surface is free from fissures and optically integral to the same extent as the rest of the body.

The density of the ring cluster of compacted crystals surrounding the forged optical body is 3.63. The resolution of the single crystal ingot is measured before it is forged, and found to have a relative pulse height of 8.25. The resolution of the forged optical body is measured in the same way and found to be 8.25, indicating there has been no change in the optical properties of the crystal due to the change of shape of the ingot, and the change from its monocrystalline form to a polycrystalline form. The density of the ingot is measured before it is forged and found to be 3.66. The density is similarly measured after the ingot is forged and found to be 3.66, indicating there has been no change in density.

In an analogous manner other hot press-forgings are carried out with other melt-grown scintillation macrocrystals, and also with extrudates of such crystals, in each case surrounding the macrocrystal or extrudate with a crystal powder having voids therewithin, the volume of the powder being equal to or less than the volume of the annular space. The tapped bulk density of the crystal powder in the annular space will generally be in the range from about one-third to about one-half the density of the optical body. The press-forgings obtained were essentially free from undesirable dislocations at or near all the surfaces of the forged optically integral body.

I claim:

1. A polycrystalline press-forged composite, comprising
   (a) a central zone of an optically integral fully dense and homogeneous polycrystalline body being transparent in at least a portion of the wave length range from about 0.2 to about 30 microns, said body composed of a normally frangible material selected from the group consisting of an alkali metal halide, an alkaline earth metal halide, and an optical oxide, said body derived from an ingot or an extrudate and prepared by pressing the ingot or extrudate to obtain a deformation ratio greater than 1.0, and
   (b) an outer zone surrounding said central zone and consisting of a cluster of compacted hot-pressed crystals having a density in excess of 98% of the fully dense central zone, said crystals having a particle size in the range of 20 microns to 250 microns and having essentially the same thermal coefficient of expansion as said material in the central zone.

2. The polycrystalline press-forged composite of claim 1, wherein the deformation ratio is from about 1.2 to about 10.

* * * * *